(12) United States Patent
Rothmaler (10) Patent No.: US 9,923,064 B2
(45) Date of Patent: Mar. 20, 2018

(54) VERTICAL SEMICONDUCTOR DEVICE

(71) Applicant: Infineon Technologies Austria AG, Villach (AT)

(72) Inventor: Rudolf Rothmaler, Villach (AT)

(73) Assignee: Infineon Technologies Austria AG, Villach (AT)

( * ) Notice: Subject to any disclaimer, the term of this patent is extended or adjusted under 35 U.S.C. 154(b) by 23 days.

(21) Appl. No.: 14/935,180

(22) Filed: Nov. 6, 2015

(65) Prior Publication Data

US 2016/0141376 A1    May 19, 2016

(30) Foreign Application Priority Data

Nov. 13, 2014   (DE) .................. 10 2014 116 625

(51) Int. Cl.
| | |
|---|---|
| *H01L 29/10* | (2006.01) |
| *H01L 29/78* | (2006.01) |
| *H01L 29/40* | (2006.01) |
| *H01L 21/765* | (2006.01) |
| *H01L 29/06* | (2006.01) |
| *H01L 29/423* | (2006.01) |
| *H01L 29/66* | (2006.01) |
| *H01L 29/739* | (2006.01) |
| *H01L 29/16* | (2006.01) |

(52) U.S. Cl.
CPC .......... *H01L 29/407* (2013.01); *H01L 21/765* (2013.01); *H01L 29/0696* (2013.01); *H01L 29/4238* (2013.01); *H01L 29/42372* (2013.01); *H01L 29/66734* (2013.01); *H01L 29/7397* (2013.01); *H01L 29/7811* (2013.01); *H01L 29/7813* (2013.01); *H01L 29/1608* (2013.01); *H01L 2924/0002* (2013.01)

(58) Field of Classification Search
CPC ................................... H01L 29/0696
See application file for complete search history.

(56) References Cited

U.S. PATENT DOCUMENTS

| | | | |
|---|---|---|---|
| 2011/0084365 A1 | 4/2011 | Law et al. | |
| 2013/0299849 A1* | 11/2013 | Tega | H01L 29/0607 257/77 |
| 2015/0008450 A1* | 1/2015 | Suekawa | H01L 21/8213 257/77 |
| 2016/0126314 A1* | 5/2016 | Shimatou | H01L 29/0634 257/329 |
| 2016/0163703 A1* | 6/2016 | Kaguchi | H01L 29/78 257/77 |

* cited by examiner

*Primary Examiner* — Victor A Mandala
*Assistant Examiner* — Regan J Rundio
(74) *Attorney, Agent, or Firm* — Murphy, Bilak & Homiller, PLLC (57) ABSTRACT

A vertical semiconductor device includes a semiconductor body having a front side, a backside arranged opposite to the front side and a lateral edge delimiting the semiconductor body in a horizontal direction perpendicular to the front side, a gate metallization arranged on the front side and extending at least close to the lateral edge; a contact metallization arranged on the front side and between the lateral edge and the gate metallization, and a backside metallization arranged on the backside and in electric contact with the contact metallization. The gate metallization is arranged around at least two sides of the contact metallization when viewed from above.

16 Claims, 6 Drawing Sheets

VERTICAL SEMICONDUCTOR DEVICE

PRIORITY CLAIM

This application claims priority to German Patent Application No. 10 2014 116 625.6 filed on 13 Nov. 2014, the content of said application incorporated herein by reference in its entirety.

TECHNICAL FIELD

Embodiments of the present invention relate to vertical semiconductor devices, in particular to vertical semiconductor transistors, and to methods for manufacturing vertical semiconductor devices.

BACKGROUND

Semiconductor devices, in particular field-effect controlled switching devices such as a Metal Oxide Semiconductor Field Effect Transistor (MOSFET) and an Insulated Gate Bipolar Transistor (IGBT) have been used for various applications including but not limited to use as switches in power supplies and power converters, electric cars, air-conditioners, and even stereo systems.

Particularly with regard to power applications, vertical semiconductor devices with two power metallization arranged on opposite sides of a semiconductor substrate and a control metallization arranged on one of the sides are often used. For example, a vertical MOSFET may have a source metallization and a gate metallization on the front side of the semiconductor substrate, and a drain metallization on the back side of the semiconductor substrate. To ensure reverse blocking voltage in an off-state, ring-shaped field-plates on drain potential surrounding an active device area with a plurality of MOSFET-cells each having a gate electrode may be used at or close to the front side. The ring-shaped field-plates may be contacted to the drain metallization via a metal contact arranged on the front side in a corner region of the semiconductor substrate. Due to design requirements of the metallizations, a distance between gate fingers or gate runners of the gate metallizations and the gate electrodes may be larger for gate electrodes closer to the corner region. This may result in a higher gate resistance of gate electrodes closer to the corner region.

For these and other reasons there is a need for the present invention.

SUMMARY

According to an embodiment of a vertical semiconductor device, the vertical semiconductor device includes: a semiconductor body having a front side, a backside arranged opposite to the front side and a lateral edge delimiting the semiconductor body in a horizontal direction perpendicular to the front side; a gate metallization arranged on the front side and extending at least close to the lateral edge; a contact metallization arranged on the front side and between the lateral edge and the gate metallization; and a backside metallization arranged on the backside and in electric contact with the contact metallization. The gate metallization is arranged around at least two sides of the contact metallization when viewed from above.

According to an embodiment of a vertical semiconductor transistor, the vertical semiconductor transistor includes: a semiconductor body having a front side, a backside arranged opposite to the front side and a lateral edge delimiting the semiconductor body in a direction perpendicular to the front side; a front side metallization arranged on the front side; a contact metallization arranged on the front side next to the lateral edge; a gate metallization arranged on the front side and between the front side metallization and the contact metallization; and a backside metallization arranged on the backside.

According to an embodiment of a method for producing a vertical semiconductor device, the method includes: providing a semiconductor wafer having a front side; defining a device area of the semiconductor wafer, the device area having an active area and a peripheral area surrounding the active area when viewed from above; forming on the front side a contact metallization arranged in the peripheral area and in Ohmic contact with the semiconductor wafer; forming on the front side a gate metallization arranged in the peripheral area; forming on a backside of the semiconductor wafer, the backside being opposite to the front side, a backside metallization in Ohmic contact with the semiconductor wafer in the device area; and separating the semiconductor wafer into individual vertical semiconductor devices so that a semiconductor body of one of the individual vertical semiconductor devices substantially corresponds to the device area of the semiconductor wafer and is, in a direction perpendicular to the front side, delimited by a lateral edge. The method is performed such that the contact metallization is arranged between the lateral edge and the gate metallization and that the gate metallization is arranged around at least two sides of the contact metallization when viewed from above.

Those skilled in the art will recognize additional features and advantages upon reading the following detailed description, and upon viewing the accompanying drawings.

BRIEF DESCRIPTION OF THE DRAWINGS

The components in the Figures are not necessarily to scale, instead emphasis being placed upon illustrating the principles of the invention. Moreover, in the Figures, like reference numerals designate corresponding parts. In the drawings.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the Figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a main side or a main surface of a semiconductor substrate or body. This can be for instance the upper or front side (surface) but also a lower or backside side (surface) of a wafer or a die.

The term "vertical" as used in this specification intends to describe an orientation which is substantially arranged perpendicular to the main side, i.e., parallel to the normal direction of the main side of the semiconductor substrate or body.

The terms "above" and "below" as used in this specification intends to describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Specific embodiments described in this specification pertain to, without being limited thereto, to vertical semiconductor devices, in particular to vertical semiconductor transistors such as vertical n-channel or p-channel MOSFETs or IGBTs, in particular to vertical power MOSFETs and vertical power IGBTs, and to manufacturing methods therefor.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs (field-effect transistors) having a gate insulator that is not an oxide, i.e., the term MOSFET is used in the more general term meaning of IGFET (insulated-gate field-effect transistor) and MISFET (metal-insulator-semiconductor field-effect transistor), respectively.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region of the first conductivity type and a drift region of the first conductivity type. The drift region may be in contact with a drain region.

In the context of the present specification, the term "gate electrode" intends to describe an electrode which is situated next to, and configured to form and/or control a channel region. The term "gate electrode" shall embrace an electrode or conductive region which is situated next to, and insulated from the body region by an insulating region forming a gate dielectric region and configured to form and/or control a channel region through the body region by charging to an appropriate voltage.

Typically, the gate electrode is implemented as trench-gate electrode, i.e., as a gate electrode which is arranged in a trench extending from the main surface into the semiconductor substrate or body.

Typically, the semiconductor device is a vertical power field-effect transistor having an active area with a plurality of FET-cells (field-effect-transistor-cells such as MOSFET-cells, IGBT-cells and reverse conducting IGBT-cells) for controlling a load current between two power metallization arranged opposite, e.g., between a front side metallization and a backside metallization. Furthermore, the vertical power field-effect transistor has a peripheral area with at least one edge-termination structure at least partially surrounding an active area of FET-cells when seen from above.

In the context of the present specification, the term "metallization" intends to describe a region or a layer with metallic or near metallic properties with respect to electric conductivity. A metallization may be in contact with a semiconductor region to form an electrode, a pad and/or a terminal of the semiconductor device. The metallization may be made of and/or comprise a metal such as Al, Ti, W, Cu, and Mo, or a metal alloy such as NiAl. The metallization may also include different electrically conductive materials, for example a stack of those metals and/or alloys.

In the context of the present specification, the terms "in ohmic contact", in resistive electric contact" and "in resistive electric connection" intend to describe that there is an ohmic current path between respective elements or portions of a semiconductor device at least when no voltages or only low testing voltages are applied to and/or across the semiconductor device. Likewise, the terms in low ohmic contact, "in low resistive electric contact" and "in low resistive electric connection" intend to describe that there is a low resistive ohmic current path between respective elements or portions of a semiconductor device at least when no voltages are applied to and/or across the semiconductor device. Within this specification the terms "in low ohmic contact," "in low resistive electric contact," "electrically coupled," and "in low resistive electric connection" are used synonymously.

The term "power semiconductor device" as used in this specification intends to describe a semiconductor device on a single chip with high voltage and/or high current switching capabilities. In other words, power semiconductor devices are intended for high current, typically in the Ampere range and/or high voltages, typically above about 30° V, more typically above about 100 V, even more typically above about 400 V or even above about 600 V.

The term "edge-termination structure" as used in this specification intends to describe a structure that provides a transition region in which the high electric fields around an active area of the semiconductor device change gradually to the potential at or close to the edge of the device and/or between a reference potential such as ground and a high voltage e.g., at the edge and/or backside of the semiconductor device. The edge-termination structure may, for example, lower the field intensity around a termination region of a rectifying junction by spreading the electric field lines across the termination region.

In the context of the present specification, the term "field-plate" intends to describe an conductive region which is arranged next to a semiconductor region, for example the drift region or a part thereof, and/or next to a pn-junction formed in the semiconductor region, insulated from the semiconductor region, and made of a material of sufficient electric conductivity such as highly doped poly-silicon, a silicide, a metal or the like to form an equipotential region, i.e., a region in which a variation of the electric potential is at least one order of magnitude lower, more typically at least two orders of magnitude lower compared to a voltage drop in the adjacent semiconductor region(s) in an operating mode of the semiconductor device. The "field-plate" may be configured to expand a depleted portion in the semiconductor region by charging to an appropriate voltage, typically a negative voltage with regard to an adjacent semiconductor region for an n-type semiconductor region.

In the following, embodiments pertaining to semiconductor devices and manufacturing methods for forming semiconductor devices are explained mainly with reference to silicon (Si) semiconductor devices having a monocrystalline Si semiconductor body. Accordingly, a semiconductor region or layer is typically a monocrystalline Si-region or Si-layer if not stated otherwise.

It should, however, be understood that the semiconductor body can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaP), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body is made of a wide band-gap material, i.e., of a semiconductor material with a band-gap of at least about two electron volts such as SiC or GaN and having a high breakdown field strength and high critical avalanche field strength, respectively, the doping of the respective semiconductor regions can be chosen higher which reduces the on-state resistance $R_{on}$.

Figure 1:
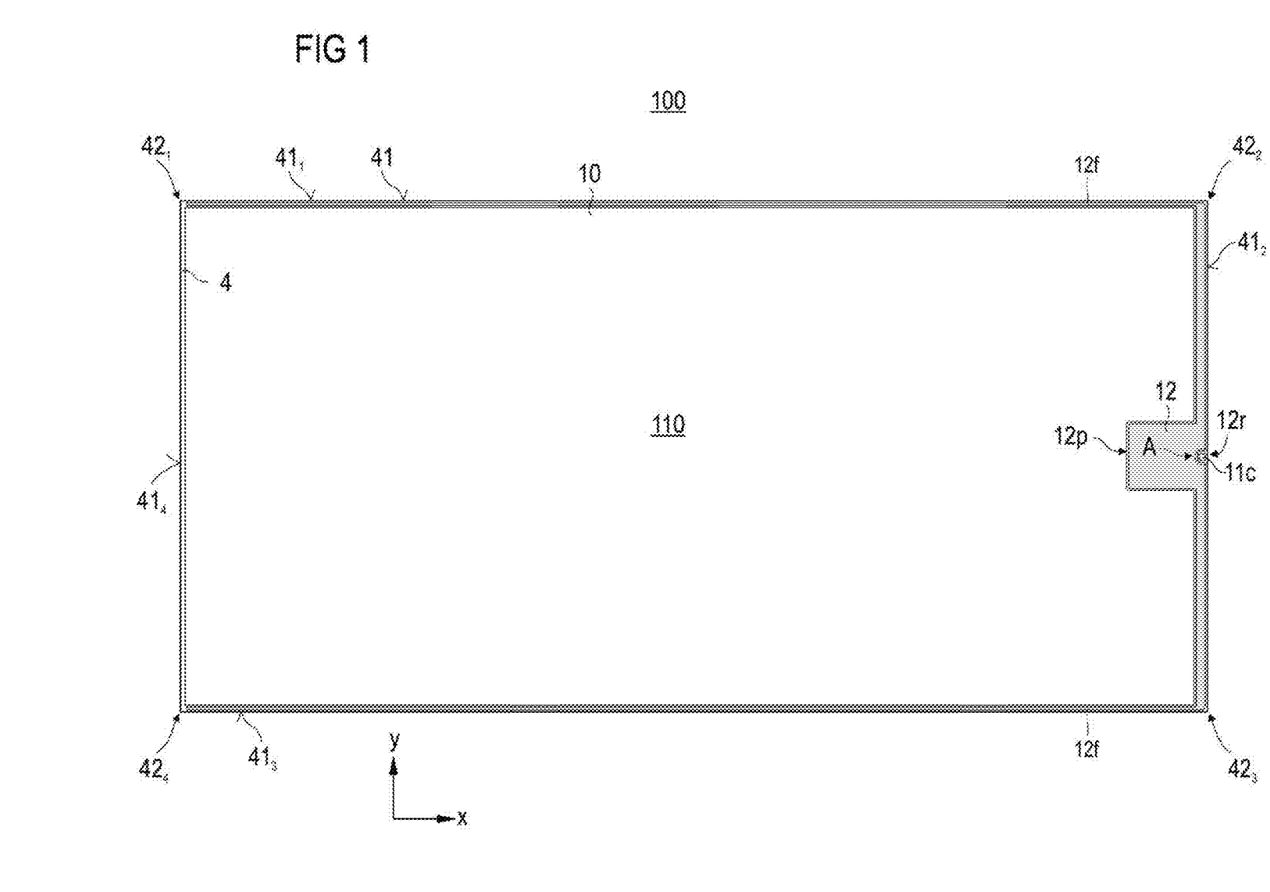
FIG. 1 illustrates a top view of a vertical semiconductor device according to an embodiment.

FIG. 1 illustrates a top view of a vertical semiconductor device 100. The vertical semiconductor device 100 has a semiconductor body extending between a front side and a backside arranged opposite to the front side 101. However, the front side and the semiconductor body are not visible in FIG. 1 as the front side is (substantially) covered by one or more dielectric layers 4 and metallization 10, 11c, 12 arranged thereon. The backside arranged below in the top view is also hidden in FIG. 1.

The front side and the backside are typically arranged in horizontal planes as indicated by the x-y co-ordinate system. In horizontal directions (x, y) the semiconductor body is delimited by (extends to) a lateral edge 41 surrounding the semiconductor body.

The horizontal extension(s) of the semiconductor body and the vertical semiconductor device 100, respectively, may be up to several millimeters (mm) or even larger than a centimeter (cm). The vertical extension of the semiconductor body typically depends on type and the voltage class of the semiconductor device 100, i.e. the desired voltage blocking capability, and is typically below a few 100 microns (μm). For example, the vertical extension of the semiconductor body of a 600V vertical IGBT or MOSFET and a 1200V vertical IGBT or MOSFET may be about 70 μm and about 110 μm to about 140 μm, respectively. The vertical extension of the semiconductor body is typically at least one order of magnitude lower, more typically at least two orders of magnitude lower than the horizontal extension(s).

The front side and the backside may be of rectangular shape as indicated by the numerals $41_1$ to $41_4$ each representing one of four portions or sides of the lateral edge 41 that may be formed as respective vertically orientated edge surfaces $41_1$ to $41_4$ extending between the front side and the backside. Accordingly, the semiconductor body and the vertical semiconductor device 100, respectively, may have four corners and corner regions $42_1$ to $42_4$, respectively, where the four portions $41_1$ to $41_4$ meet pairwise.

As illustrated in FIG. 1, a major (central) portion of the semiconductor body, e.g., more than 90%, may be covered by a front side metallization 10 typically providing a first load terminal. On the backside, a backside metallization is arranged which typically provides a second load terminal. The backside metallization is also hidden in FIG. 1 and may at least substantially cover the backside, typically more than 95% of the backside, i.e., extend to or close to the edge portions $41_1$-$41_4$.

In embodiments referring to MOSFETs, the front side metallization 10 may be a source metallization and the backside metallization may be a drain metallization, or vice versa in a so called source-down configuration.

In embodiments referring to IGBTs, the front side metallization 10 may be an emitter metallization and the backside metallization may be a collector metallization or vice versa.

The front side metallization and the backside metallization are typically in Ohmic contact with respective semiconductor portions of the semiconductor body 40.

In embodiments referring to vertical power transistors capable of controlling large currents between the front side metallization 10 and the backside metallization, the front side metallization 10 and the backside metallization are in contact with a plurality of transistor cells or transistor structures arranged in an active area 110 surrounded by a peripheral area when seen from above.

The front side metallization 10 may substantially cover the transistor structures in the active area 110. The active area 110 and the front side metallization 10 may even substantially correspond to each other when seen from above, i.e., the ratio of non-overlapping parts to overlapping parts is typically smaller than about 0.05 or even 0.01.

In the exemplary embodiment illustrated in FIG. 1, a control metallization 12 surrounding the front side metallization 10 from three sides when seen from above is arranged on the front side.

The control metallization 12 is typically arranged in the peripheral area (without active transistor cells contacted to the front side metallization 10 and the backside metallization).

In embodiments referring to IGBTs or MOSFETs, the control metallization 12 is in Ohmic contact to gate electrodes of the transistor cells and thus forms a gate metallization 12. Embodiments explained in the following with regard to the gate metallization typically also apply to the control metallization.

Typically, the gate metallization 12 extends close to the edge 41 but is spaced apart from the edge. For example, the gate metallization 12 may be at a (minimum) distance from about 1 μm to about 20 μm or even to about 50 μm from the edge 41.

The gate metallization 12 typically includes a portion 12p forming a gate pad as a third terminal of the three-terminal vertical semiconductor device 100.

Depending on horizontal size, the gate metallization 12 may include portions 12f forming gate fingers or gate runners for providing a low resistive contact to gate electrodes further away from the gate pad 12p.

In the exemplary embodiment, the gate pad 12p is formed next to the right edge surfaces 41$_2$ and substantially equally spaced from the two closest (adjacent) corner regions 42$_2$, 42$_3$. Due to the symmetric layout of the gate metallization 12, uniform gate characteristics are facilitated.

According to an embodiment, a contact metallization 11c in electric contact with the backside metallization through the semiconductor body is arranged on the front side and between the lateral edge 41 and the gate metallization 12, more typically between the gate pad 12p and the edge 41, and even more typically in an opening or recess 12r of the gate pad 12p next to the edge 41. Accordingly, the gate metallization 12 is arranged between the front side metallization 10 and the contact metallization 11c. In the exemplary embodiment, the gate metallization 12 is around three sides of the contact metallization 11c when viewed from above.

Depending on the metal(s) used for manufacturing the gate metallization 12 and the contact metallization 11c (and the front side metallization), different design rules apply for the metallization. In particular, a minimum distance (minimum design distance) between the contact metallization 11c and the gate metallization 12 is typically in a range from about 5 μm to about 25 μm, more typically in a range from about 10 μm to about 25 μm. For example, the minimum distance between the contact metallization 11c and the gate metallization 12 may be in a range from about 10 μm to about 12 μm when aluminum is used for manufacturing the gate metallization 12 and the contact metallization 11c. In another example copper is used for manufacturing the gate metallization 12 and the contact metallization 11c. In this case, the minimum distance between the contact metallization 11c and the gate metallization 12 is typically larger and may be in a range from about 22 μm to about 24 μm.

The gate pad 12p typically requires some area, e.g., a compact area of about 10000 μm$^2$ or even more. To reduce loss of active area 110, the gate pad 12p is typically partly surrounded by the front side metallization 10 as illustrated in FIG. 1.

The electric contact between the backside metallization and the contact metallization 11c may be a resistive electric contact, for example a low resistive electric contact.

In particular in embodiments referring to power semiconductor devices with higher rated blocking voltages of 400 V or more, the electric contact may also be a non-resistive one. However, the voltage difference between the contact metallization 11c and the backside metallization during the blocking mode should be small compared to the voltage difference between the backside metallization and the front side metallization 10 the blocking mode, typically less than 1%. This is to ensure that the contact metallization 11c and the backside metallization are substantially on the same electric potential during the blocking mode. For example, the leakage current of a then reversely biased diode arranged between the contact metallization 11c and the backside metallization may be sufficient for electrical voltage compensation between the contact metallization 11c and the backside metallization in the blocking-mode.

As will be explained below with regard to FIG. 2A and FIG. 2B, the contact metallization 11c may be used for contacting edge-termination structures at least during the blocking mode to the potential applied to the backside metallization or at least close to the potential. Compared to other solutions in which the contact metallization 11c is realized in one or more corner regions 42$_{1-4}$, a better contact between the gate metallization 12 and the gate electrodes next to the corner region(s) 42$_{1-4}$ at a comparable area used may be achieved by the design explained with regard to FIG. 1. Further, the risk of damaging the contact metallization 11c during wafer sawing is reduced when arranged apart from the corner region(s) 42$_{1-4}$.

Typically, distance between the contact metallization 11c and the closest corner regions 42$_{1-4}$ is at least one order of magnitude larger than a minimum distance between the contact metallization 11c and the lateral edge 41.

The minimum distance between the contact metallization 11c and the lateral edge 41$_2$ may be in a range from about 5 μm to about 25 μm, more typically in a range from about 5 μm to about 20 μm.

Typically, a maximum horizontal extension of the contact metallization 11c is about at least one order of magnitude lower than a maximum horizontal extension of the gate metallization 12.

Figure 2A:
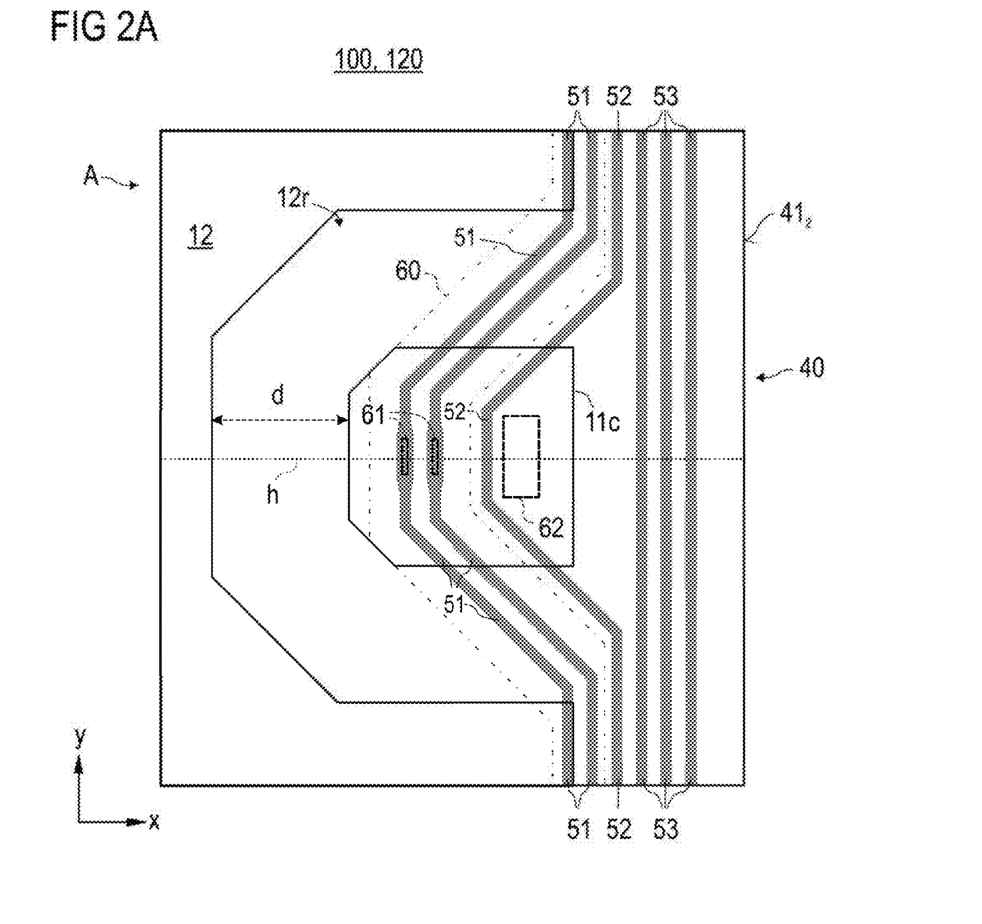
FIG. 2A illustrates a layout corresponding to a section of the top view of the vertical semiconductor device shown in FIG. 1 according to an embodiment.

FIG. 2A illustrates in a top view a section of the vertical semiconductor device corresponding to the area A of FIG. 2A around the contact metallization 11c. FIG. 2B illustrates a vertical cross-section through the vertical semiconductor 100 device along horizontal line h of FIG. 2A. In both figures, the reference numeral d denotes a distance between the contact metallization 11c and the gate metallization 12 which is at least about the minimum design distance as explained above with regard to FIG. 1.

Figure 2B:
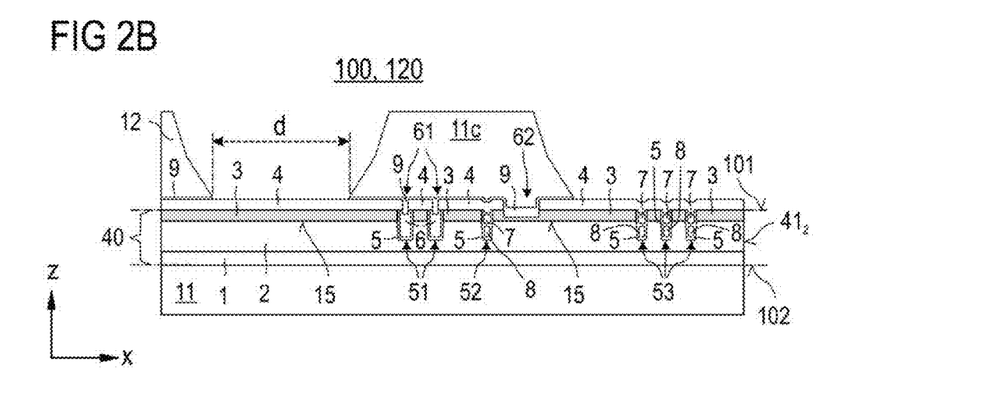
FIG. 2B illustrates a vertical cross-section through the vertical semiconductor device illustrated in FIG. 1 and FIG. 2A according to an embodiment.

In the exemplary embodiment illustrated in FIG. 2B, the vertical semiconductor 100 is implemented as a MOSFET. Accordingly, the semiconductor body 40 includes a drain layer 1, e.g., a highly n-doped substrate, extending to the backside 102 in ohmic contact with the drain metallization 11 arranged at the backside 102 and with a drift layer 2, e.g. an n-doped epitaxial layer, arranged on the a drain layer 1. Further, a body layer 3, e.g., a p-doped epitaxial layer, forming a pn-junction 15 with the drift layer 2 is arranged between the drift layer 2 and the front side 101. A dielectric layer 4 such as a BPSG-layer (borophosphosilicate glass) is arranged on the front side 101. The dielectric layer 4 may also be implemented as a stack of dielectric layers. For example, a silicon oxide layer or a silicon nitride layer may be formed at the front side 101 and a thicker BPSG-layer or the like may be formed thereon.

One or more vertical trenches 53 extending from the front side 101 into the drift layer 2, i.e., through the body layer 3 and the pn-junction 15, may be arranged, in horizontal direction x, between the contact metallization 11c and the edge $41_2$.

Typically, the one or more vertical trenches 53 surround the active area (not shown in FIG. 2A and FIG. 2A) close to the edge. For example, the vertical trenches 53 may be substantially ring-shape when viewed from above.

The vertical trenches 53 may include floating gate electrodes 7 and/or floating field-plates 8 which are insulated by a dielectric 5 such as silicon oxide from the semiconductor body 40. Accordingly, floating chipping stoppers are provided next to the edge $41_2$.

Typically, the floating gate electrodes 7 and the floating field-plates 8 are made of highly doped poly-silicon.

A further vertical trench 52 with floating gate electrodes 7 and/or floating field-plates 8 surrounding the active area may be arranged below the contact metallization 11c (overlapping the contact metallization 11c when viewed from above).

In the active area, a plurality of trench MOSFET-cells may be arranged which includes vertical trenches similar to the vertical trenches 53. However, the gate electrodes of the vertical trenches in the active area are not floating but in Ohmic contact with the gate metallization 12 and the field-plates of the vertical trenches in the active area are typically in Ohmic contact with the front side metallization (source metallization).

The gate electrodes and the field-plates of the active area are typically also made of highly doped poly-silicon.

In the exemplary embodiment, each of the gate metallization 12, the contact metallization 11c and the not shown source metallization is formed by a thin contact portion 5, e.g., made of wolfram, and a thicker main portion, e.g., made of aluminum, arranged on and at the corresponding contact portion 5.

Typically, the gate metallization 12, the contact metallization 11c and the source metallization are formed by common manufacturing processes and have the same composition, respectively.

In the exemplary embodiment, the contact metallization 11c is in ohmic contact with one or more edge-termination structures implemented as field-plates 6, e.g. also made of highly doped poly-silicon. Each of the two exemplary field-plates 6 is insulated by a dielectric 5, e.g., made of silicon oxide, arranged in a trench 51 extending from the front side 101 partially into the drift layer 2 and typically surrounding the active area when viewed from above. Accordingly, the two exemplary field-plates 6 are adjacent to the pn-junction 15.

The trenches 51, 52, 53 may extend (in z-direction) to the same vertical depth.

Further, the trenches 51, 52, 53 may be manufacture in common processes, e.g. by masked etching. However, each of the trenches 51 of the area 60 in FIG. 2B typically corresponding to a chip layout are only filled with one field-plate.

In order to be operable as edge-termination structures, a sufficiently good electric contact between the field-plates 6 and the drain metallization 11 during the blocking mode is required. For this purpose, the contact metallization 11c is used.

In the exemplary embodiment, each field-plate 6 is in Ohmic contact with the contact metallization 11c via a first trench contact portion of the contact metallization 11c arranged in a first shallow trench 61 extending through the dielectric layer(s) 4 to the respective field-plate 6. The contact metallization 11c is in ohmic contact with the semiconductor body 40, at least with an outer portion of the body layer 3, typically via a second trench contact portion of the contact metallization 11c arranged in second shallow trench 62 extending through the dielectric layer(s) 4 at least to the body layer 3 and the front side 101, respectively.

The second shallow trench 62 is typically arranged between the first shallow trench 61 and the closest edge portion $41_2$ and may have a larger horizontal extension than the first shallow trench 61 to ensure a sufficiently good electric contact between the contact metallization 11c and the drain metallization 11.

When the n-channel MOSFET 100 is switched into the blocking mode, in which the channels are closed and the pn-junction 15 is reversely biased, a leakage current of a diode formed underneath the second shallow trench 62 between the drift layer 2 and the portion of the body layer 3 in Ohmic contact with the contact metallization 11c will at sufficiently high blocking voltages of e.g. 1000 V or more result in a compensation of any voltage difference between the contact metallization 11c and the drift layer 2 and the backside metallization (drain metallization) 11, respectively. Once the voltage difference is compensated (zero or at least substantially zero), the contact metallization 11c remains on drain potential (potential of the drain metallization 11). Further, the leakage current of the diode in contact with the contact metallization 11c may additionally be increased, e.g. by sawing at the right edge $41_2$.

Alternatively, the second shallow trench 62 may extend to or even partly into the drift layer 2. Accordingly, a low Ohmic contact between the field-plates 6 and the drain metallization 11 is achieved.

Figure 3:
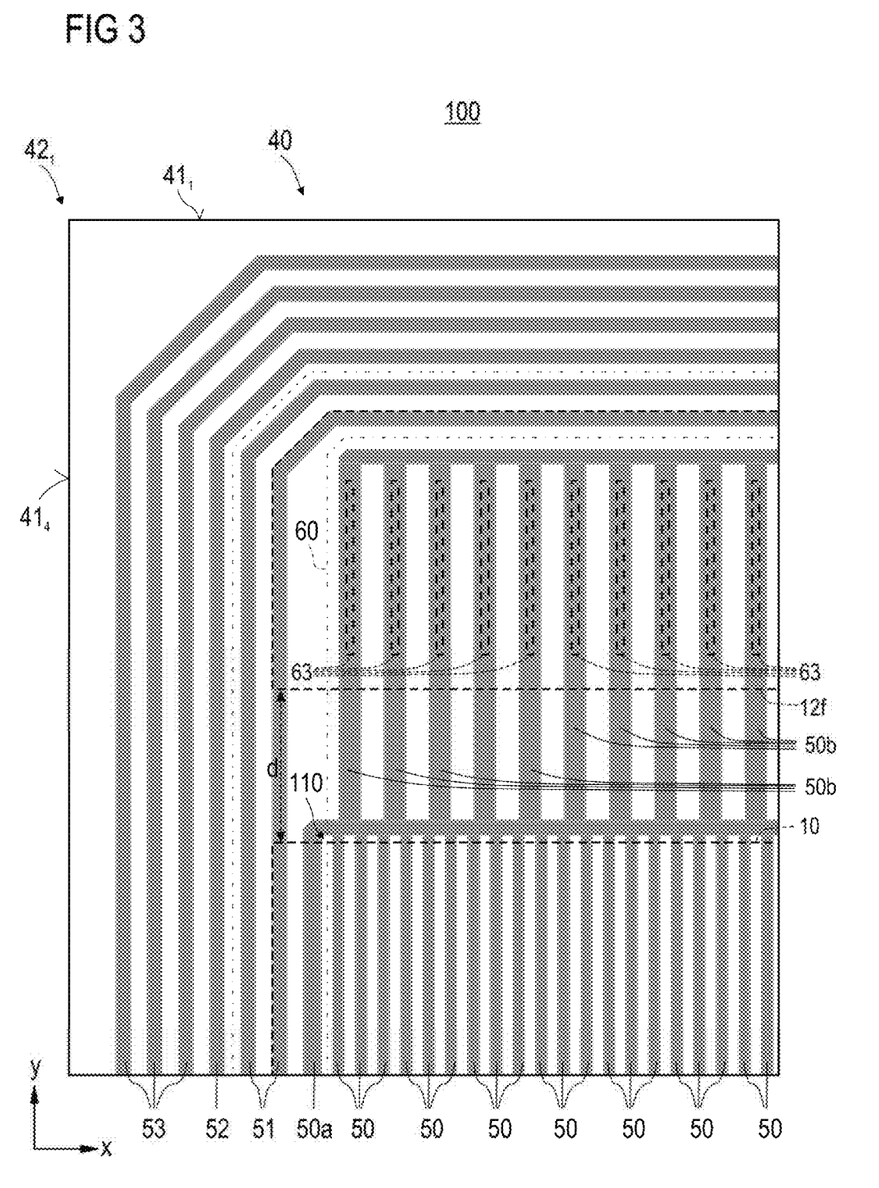
FIG. 3 illustrates a corner region of the vertical semiconductor device shown in FIG. 1 according to an embodiment.

FIG. 3 illustrates the vertical semiconductor device 100 in a region of the left upper corner $42_1$ shown in FIG. 1. FIG. 3 corresponds to a layout of the gate metallization 12f, the source metallization 10, the trenches 50 to 53 and of a conductive material such as highly doped poly-silicon arranged in the trenches 50 to 53, respectively, as well of shallow contact trenches 63. The shallow contact trenches 63 used for contacting the gate metallization 12f with the gate fingers 50b which are in following referred to as poly-silicon gate fingers. The trenches 50-50b, 52, 53 typically include two poly-silicon layers, namely an upper poly-silicon layer forming the gate electrodes and a lower poly-silicon layer forming the field-plates. However, the portion 50a of the trench 50 may as the trenches 51 only include one poly-silicon layer as indicated by the area 60.

Typically, only the gate electrodes in the trench portion 50 in the active area 110 and below the source metallization 10 are connected with the gate metallization 12f. Due to the design, the length of current path distance and resistance, respectively, between the gate electrodes and the gate metallization 12f is substantially the same, i.e., varies only in accordance with manufacturing variations. This ensures uniform gate characteristics of the exemplary MOSFET-cells of the active area 110.

Figure 4A:
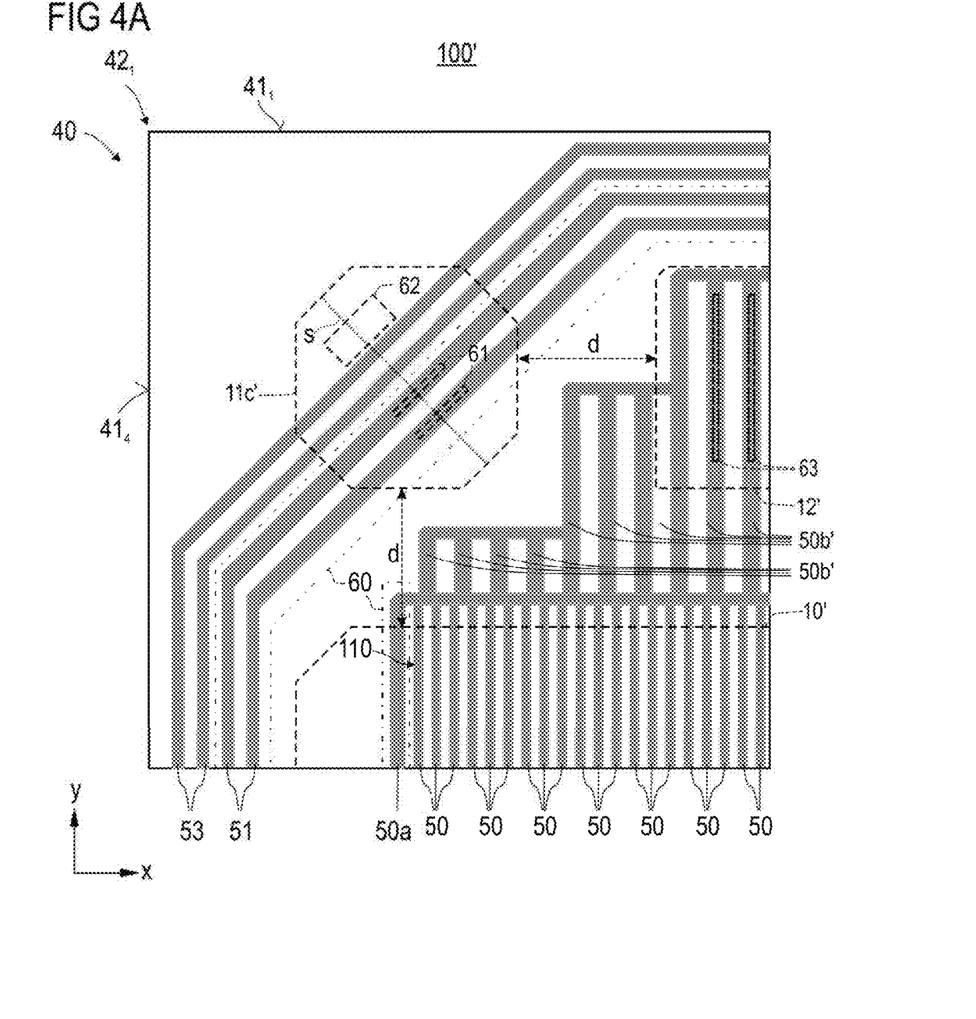
FIG. 4A illustrates a layout of a vertical semiconductor device.
Figure 4B:
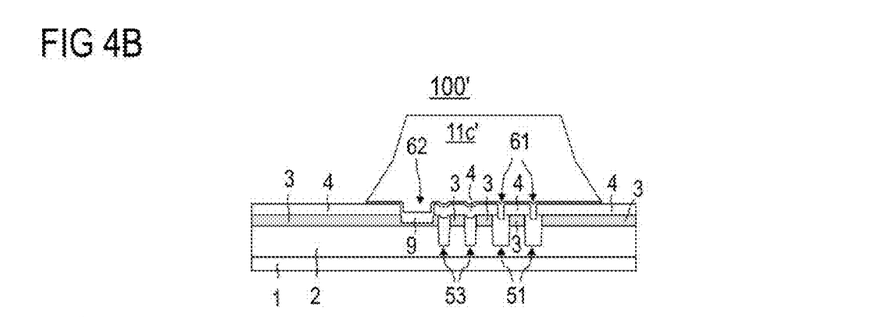
FIG. 4B illustrates a vertical cross-section through the vertical semiconductor device shown in FIG. 4A.

FIG. 4A illustrates a layout of a vertical semiconductor device 100' in a corner region. FIG. 4B illustrates a vertical cross-section through the vertical semiconductor 100 device along horizontal line s of FIG. 4A.

The vertical semiconductor device 100' is similar to the vertical semiconductor device 100 explained above with regard to FIG. 1 to FIG. 3 and also includes a gate metallization 12', a contact metallization 11c' and a front side metallization 10' which arranged on a front side.

However, the contact metallization 11c' of the vertical semiconductor device 100' is arranged next to a corner 42$_1$. Due to the design rules for the metallizations 10', 11c', 12' (distance d) and a desired minimum distance to the corner 42$_1$ which has a higher damage risk during wafer sawing, the gate metallization 12' is further spaced apart from the corner 42$_1$ compared to the vertical semiconductor device 100. Accordingly, the poly-silicon gate fingers in the trench portions 50b' contacting the outermost gate electrodes in the active area 110 have a higher resistance. Accordingly, the outermost gate electrodes may be delayed during switching. Further, the switching losses are expected to be higher for the outermost active gate electrodes of the vertical semiconductor device 100'.

Figure 5:
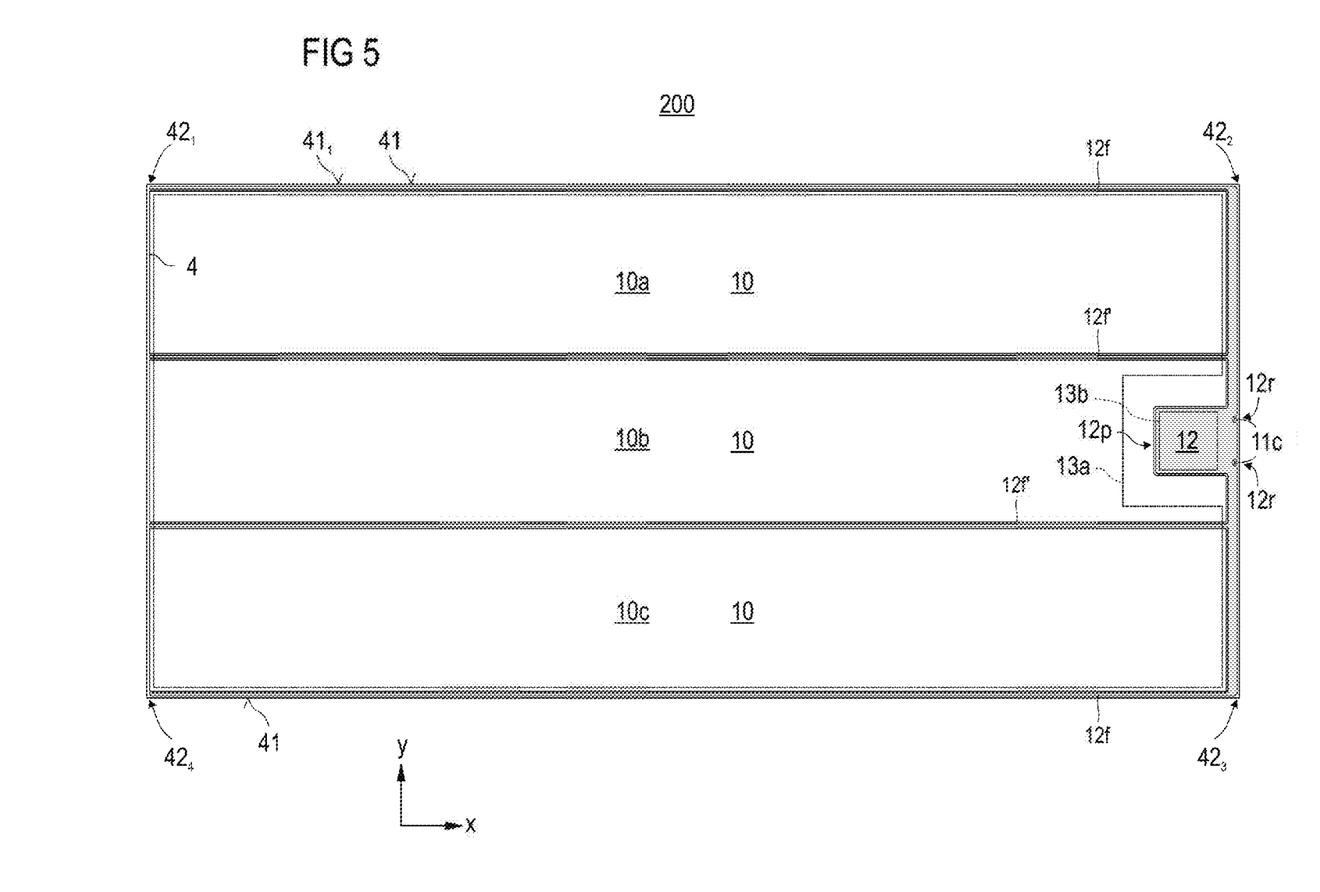
FIG. 5 illustrates a top view of a vertical semiconductor device according to an embodiment.

FIG. 5 illustrates a top view of a vertical semiconductor device 200. The vertical semiconductor device 200 is similar to the vertical semiconductor device 100 explained above with regard to FIG. 1 to FIG. 3. However, the vertical semiconductor device 200 has two contact metallization 11c next to the bond pad 12p. This may increase manufacturing yield as it is extremely unlikely that both contact metallization 11c are damaged during wafer sawing.

Further, the front side metallization 10 of the vertical semiconductor device 200 has three spaced apart portions 10a, 10b, 10c. Between portions 10a and 10b, as well as between the portions 10b and 10c an inner gate finger 12f' of the gate metallization 12 is arranged. Accordingly, the vertical semiconductor device 200 may have a larger area (larger extension in the y-direction) than the vertical semiconductor device 100 without increasing the gate resistance.

Typically, the portions 10a, 10b, 10c are electrically interconnected by a further metal structure 13a, for example a copper layer which may also be formed on the gate metallization 12 (at least the gate pad, see dashed rectangle 13b) and even on the contact metallization 11c. In this case the usually stricter design rules for copper may apply during manufacturing the vertical semiconductor device 200. Note that the inner gate fingers 12f' are separated from the further metal structure 13a by an interlayer dielectric (not shown in FIG. 5).

Figure 6:
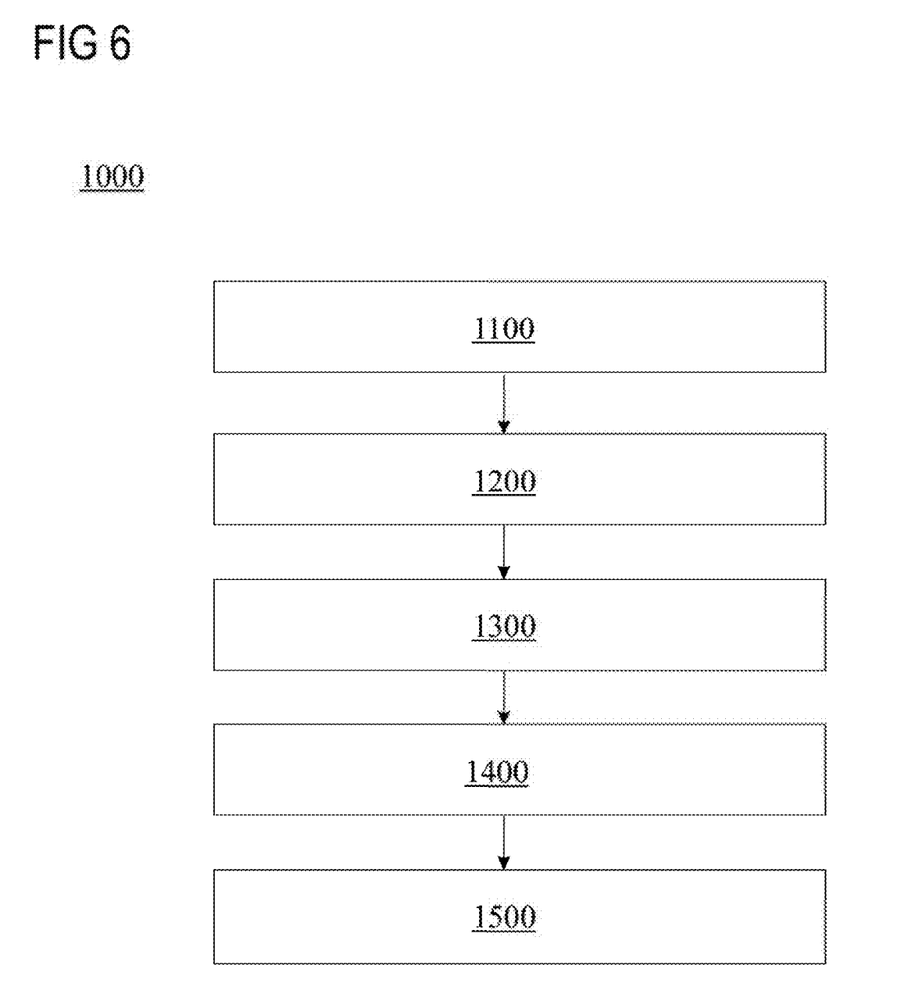
FIG. 6 illustrates method steps of a method according to embodiments.

FIG. 6 illustrates method steps of a method 1000 for producing vertical semiconductor devices, in particular vertical power semiconductor transistors 100, 200 as explained above. In the following description reference numerals are used in correspondence with the reference numerals used in FIG. 1 to FIG. 3 and FIG. 5 illustrating the vertical semiconductor devices 100, 200 that may be manufactured with the method 1000.

In a first process 1100, a semiconductor body 40, typically a semiconductor wafer 40 having a front side 101 is provided. In embodiments referring to the manufacturing of MOSFETs, the provided semiconductor wafer 40 typically includes a drain layer 1, e.g., a highly n-doped substrate, extending to a backside and in ohmic with a drift layer 2, e.g., implemented as an n-doped epitaxial layer, arranged on the a drain layer 1, and a body layer 3, e.g., a p-doped epitaxial layer, forming a pn-junction 15 with the drift layer 2 and extending the front side 101.

Thereafter, device areas corresponding to different chips may be defined in a process 1200. Each device area typically includes an active area 110 and a peripheral area 120 surrounding the active area 110 when viewed from above. Further scribe lines, surrounding the device areas and having typical width in a range from about 50 μm and to about 110 μm when viewed from above are typically defined.

Thereafter, transistor structures, e.g., MOSFET-cells typically having a gate electrode 7 and a field-plate 8 which are insulated from the semiconductor wafer, may be formed in the active chip areas 110. The gate electrodes 7 and the field-plates 8 may be arranged in portions 50 of a trench 50, 50b extending from the front side 101 at least to the pn-junction 15. Further, field-plates 6 arranged in trenches 51, extending from the front side 101 at least to the pn-junction 15 and surrounding the active area 110 and insulated by a dielectric layer 5 from the wafer may be formed.

Thereafter, a dielectric layer(s) 4 may be formed on and at the front side 101. This may include depositing TEOS.

Thereafter, a contact metallization 11c arranged in the peripheral area 120 and in Ohmic contact with the semiconductor wafer, a gate metallization 12 arranged in the peripheral area 120 and in Ohmic contact with the gate electrodes 7, and a front side metallization 10 arranged in the active area 110 and in Ohmic contact with each of the transistor structures (e.g. MOSTET cells) may be formed on the front side 101.

This may include several or all of the following processes 1300: etching shallow trenches 61, 62, 63 through the dielectric layer 4 to the field-plate 6 and to poly-silicon gate fingers formed in portions 50b of the trench 50, at least partly filing the shallow trenches 61, 62, 63 with a contact material such as wolfram, for example by depositing; forming a first metal layer on the front side 101, for example by depositing aluminum, etching the first metal layer to form spaced apart portions 10, 11c, 12 of the first metal layer; forming an interlayer dielectric layer on the first metal layer; etching the interlayer dielectric layer to expose portions of the first metal layer; forming a second metal layer on the an interlayer dielectric in Ohmic contact with the exposed portions of the first metal layer, for example by depositing copper and an optional planarization process; and/or etching the second metal layer.

Thereafter, a backside metallization 11 in Ohmic contact with the semiconductor wafer 40 may be formed on the backside 101, for example by depositing aluminum in processes 1400.

In a final process 1500, the wafer may be separated (singulated) into individual vertical semiconductor devices 100, 200, typically by sawing, dicing, or cutting along the scribe lines, so that the semiconductor body 40 of the individual vertical semiconductor devices 100, 200 substantially corresponds to the device areas of the semiconductor wafer and are, in a direction perpendicular to the front side 101, delimited by a respective lateral edge 41.

According to an embodiment, the method 1000 is performed such that the contact metallization 11c is arranged between the lateral edge 41 and the gate metallization 12 and that the gate metallization 12 is arranged around at least two sides of the contact metallization 11c when viewed from above.

According to an embodiment, the method 1000 is performed such that the gate metallization 12 is arranged between the front side metallization 10 and the contact metallization 11c when viewed from above.

According to an embodiment of a method for producing a vertical semiconductor device, the method includes: providing a semiconductor wafer having a front side; defining a device area of the semiconductor wafer, when viewed from above the device area being adjacent to a scribe line and comprising an active area and a peripheral area surrounding the active area; forming on the front side a contact metallization arranged in the peripheral area and in Ohmic contact with the semiconductor wafer; forming on the front side a control metallization arranged in the peripheral area; and forming on a backside of the semiconductor wafer opposite to the front side a backside metallization in Ohmic contact with the semiconductor wafer, so that the control metallization is arranged between the front side metallization and the contact metallization and/or so that contact metallization is arranged between the scribe line and the control metallization arranged around at least two sides of the contact metallization when viewed from above Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific FIG. may be combined with features of other Figures, even in those cases in which this has not explicitly been mentioned. Such modifications to the inventive concept are intended to be covered by the appended claims.

Spatially relative terms such as "under," "below," "lower," "over," "upper" and the like are used for ease of description to explain the positioning of one element relative to a second element. These terms are intended to encompass different orientations of the device in addition to different orientations than those depicted in the Figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A vertical semiconductor transistor, comprising:
a semiconductor body having a front side, a backside arranged opposite to the front side and a lateral edge delimiting the semiconductor body in a horizontal direction perpendicular to the front side;
a gate metallization arranged on the front side;
a contact metallization arranged on the front side and between the lateral edge and the gate metallization, wherein the gate metallization is arranged around at least two sides of the contact metallization when viewed from above; and
a backside metallization arranged on the backside and in electric contact with the contact metallization.

2. The vertical semiconductor transistor of claim 1, further comprising a front side metallization arranged on the front side, wherein the gate metallization is arranged between the front side metallization and the contact metallization.

3. The vertical semiconductor transistor of claim 1, further comprising a plurality of transistor cells arranged in an active area of the vertical semiconductor transistor, the active area being surrounded by a peripheral area of the vertical semiconductor transistor, the peripheral area extending to the lateral edge and comprising the contact metallization.

4. The vertical semiconductor transistor of claim 3, wherein the front side metallization is arranged in the active area and in Ohmic contact with at least a majority of the transistor cells.

5. The vertical semiconductor transistor of claim 3, wherein each of the transistor cells comprises a gate electrode which is insulated from the semiconductor body and in Ohmic contact with the gate metallization.

6. The vertical semiconductor transistor of claim 3, further comprising a field-plate in Ohmic contact with the contact metallization and arranged in a trench, extending from the front side at least to a pn-junction of the semiconductor body, surrounding the active area and comprising a dielectric layer arranged between the semiconductor body and the field-plate.

7. The vertical semiconductor transistor of claim 1, wherein the contact metallization is partly surrounded by a portion of the gate metallization forming a gate pad.

8. The vertical semiconductor transistor of claim 1, wherein the lateral edge has, when viewed from above, a polygonal shape comprising a corner, and wherein a distance between the contact metallization and the corner is at least one order of magnitude larger than a minimum distance between the contact metallization and the lateral edge.

9. The vertical semiconductor transistor of claim 8, wherein the minimum distance in a range from 5 µm to 25 µm.

10. The vertical semiconductor transistor of claim 9, wherein a distance between the contact metallization and the gate metallization in a range from 5 µm to 25 µm.

11. The vertical semiconductor transistor of claim 1, wherein a maximum horizontal extension of the contact metallization is at least one order of magnitude lower than a maximum horizontal extension of the gate metallization.

12. The vertical semiconductor transistor of claim 1, wherein the gate metallization, the contact metallization, and/or the front side metallization comprise a stack of at least two metals.

13. A vertical semiconductor device, comprising:
a semiconductor body having a front side, a backside arranged opposite to the front side and a lateral edge delimiting the semiconductor body in a direction perpendicular to the front side;
a front side metallization arranged on the front side;
a contact metallization arranged on the front side adjacent to the lateral edge;
a gate metallization arranged on the front side and between the front side metallization and the contact metallization; and
a backside metallization arranged on the backside,
wherein the gate metallization is insulated from the front side metallization, the contact metallization and the backside metallization.

14. The vertical semiconductor device of claim 13, wherein the vertical semiconductor device is implemented as a power field-effect transistor configured to control a current between the front side metallization and the backside metallization.

15. The vertical semiconductor device of claim 13, comprising in an active area, a plurality of gate electrodes each of which is insulated from the semiconductor body and in Ohmic contact with the gate metallization.

16. A vertical semiconductor device, comprising:
a semiconductor body having a front side, a backside arranged opposite to the front side and a lateral edge delimiting the semiconductor body in a direction perpendicular to the front side;
a front side metallization arranged on the front side;
a contact metallization arranged on the front side adjacent to the lateral edge;
a gate metallization arranged on the front side and between the front side metallization and the contact metallization;
a backside metallization arranged on the backside; and
in a peripheral area arranged between an active area and the lateral edge, a field-plate in ohmic contact with the contact metallization, extending from the front side at least to a pn-junction of the semiconductor body and surrounding the active area, and a dielectric layer insulating the semiconductor body and the field-plate from each other.

* * * * *